United States Patent
Zeidler et al.

(10) Patent No.: US 6,829,014 B1
(45) Date of Patent: Dec. 7, 2004

(54) FREQUENCY BOUNDED OSCILLATOR FOR VIDEO RECONSTRUCTION

(75) Inventors: David E. Zeidler, Warrington, PA (US); Brian Carroll, Coopersburg, PA (US)

(73) Assignee: General Instrument Corporation, Horsham, PA (US)

( * ) Notice: Subject to any disclaimer, the term of this patent is extended or adjusted under 35 U.S.C. 154(b) by 383 days.

(21) Appl. No.: 09/849,162

(22) Filed: May 4, 2001

(51) Int. Cl.[7] .................................................. H03L 7/00
(52) U.S. Cl. ...................................... 348/536; 348/537
(58) Field of Search ................................ 348/536, 537, 348/500; 331/16, 18, 1 A, 175, 20; H03L 7/00

(56) References Cited

U.S. PATENT DOCUMENTS

| | | | | |
|---|---|---|---|---|
| 4,933,959 A | * | 6/1990 | Knechtel | 375/376 |
| 5,184,091 A | * | 2/1993 | Srivastava | 331/10 |
| 5,473,385 A | * | 12/1995 | Leske | 375/240.26 |
| 5,579,348 A | * | 11/1996 | Walker et al. | 375/355 |
| 5,657,089 A | * | 8/1997 | Onagawa | 348/537 |
| 5,923,220 A | * | 7/1999 | Honma | 331/17 |
| 5,956,378 A | * | 9/1999 | Soda | 375/376 |
| 5,995,156 A | * | 11/1999 | Han et al. | 348/500 |
| 6,133,770 A | * | 10/2000 | Hasegawa | 327/156 |
| 6,396,354 B1 | * | 5/2002 | Murayama et al. | 331/17 |

* cited by examiner

*Primary Examiner*—Michael H. Lee
*Assistant Examiner*—Trang U. Tran
(74) *Attorney, Agent, or Firm*—Steven L. Nichols; Ronald P. Kananen; Rader, Fishman and Grauer PLLC

(57) ABSTRACT

A frequency range bounder for limiting the frequency of a voltage controlled oscillator uses a multiplexer that responds to comparator inputs indicating whether an input control signal will allow the oscillator frequency to go beyond a predetermined range. If the control signal keeps the frequency within the range, the control signal is sent directly to an oscillator driver. If the control signal is above or below the range, the multiplexer outputs an alternative value as the control signal. As a result, the oscillator frequency is prevented from extending beyond an allowable tolerance range.

7 Claims, 3 Drawing Sheets

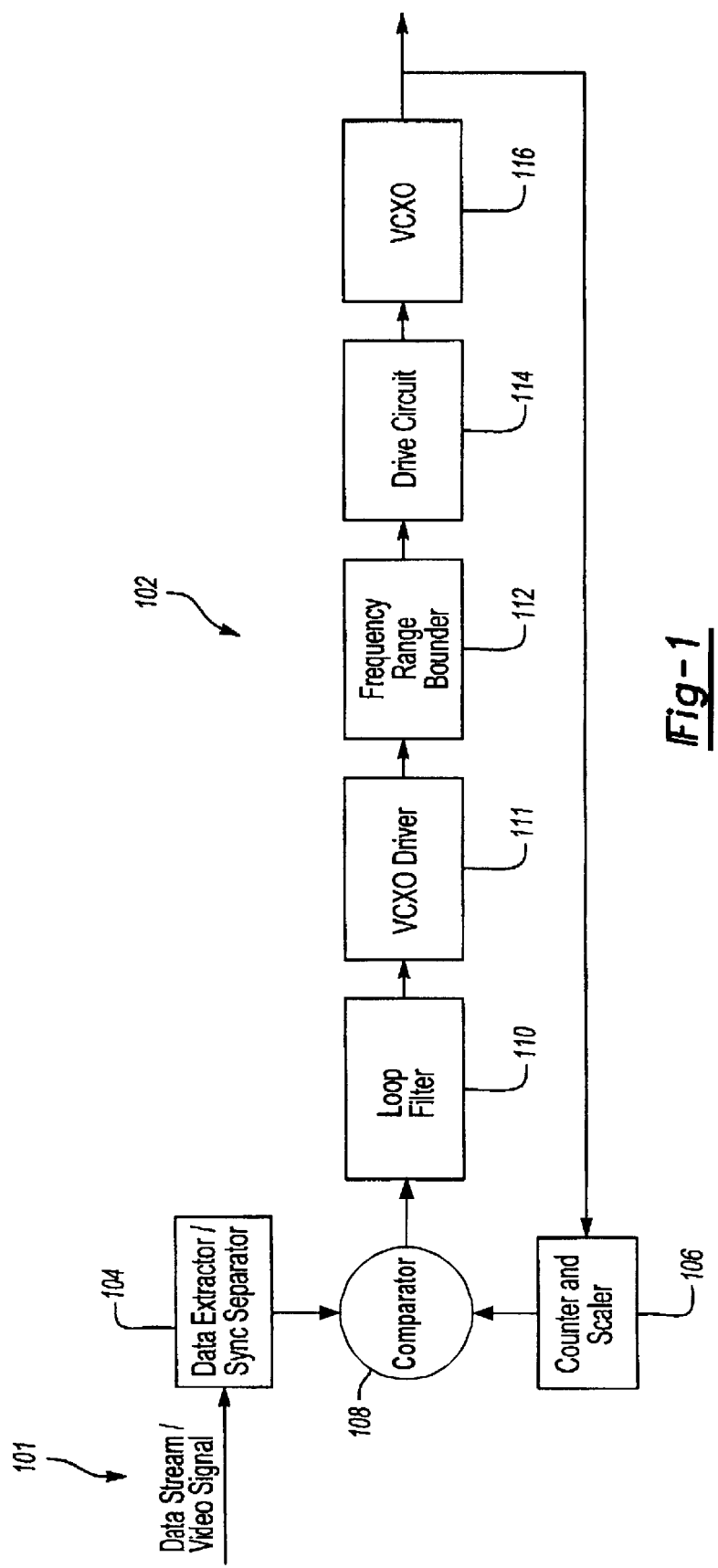

US 6,829,014 B1

FREQUENCY BOUNDED OSCILLATOR FOR VIDEO RECONSTRUCTION

BACKGROUND OF THE INVENTION

1. Field of the Invention

The present invention is related to signal encoding and decoding, and more particularly to a system for controlling an oscillator used to decode and/or reconstruct a video signal.

2. Description of the Related Art

Modern video equipment including televisions, video cassette recorders VCRs, and set-top terminals provide users with tremendous access to television programming. In particular, cable and satellite television systems may provide access to hundreds of channels of video programming. A set-top terminal is a box of electronic circuitry connected between a user's television and a cable or satellite television system for assisting the user in accessing that system.

As the equipment for providing video programming becomes more complicated and offers more features and flexibility to users, the sophistication and programming required to operate such equipment also increases. In fact, some video equipment, particularly VCRs and set-top terminals, now require substantial computing power to optimally process video and audio signals and provide user features such as timed program recording and premium channel de-scrambling.

In general, to generate a visual display on a display device, such as a television set or monitor, the information for the images to be displayed must be provided as a video signal. This is also true of an on-screen display that is derived from a video signal generated by the video equipment. Conversion of a video signal into a visual image on a display screen requires the use of a clock signal with a highly accurate frequency. Generally, the video equipment, such as a set-top terminal, creates the video signal from its internally-generated clock. The accuracy of the internally-generated clock yields the accuracy of the timing contained or embedded in the video signal sent to a video display device, e.g., a television set or monitor. The timing needs to be accurate within a predetermine range for the image to be displayed properly. For example, the generation of images on the video display device, may require timing that is accurate to within 3 to 50 ppm. Some televisions require higher timing accuracy than others.

With television signals provided by network broadcasters, or cable or satellite companies, the required signal timing is inherently a part of an analog television signal and is always included as part of a digital television signal. Therefore, when a piece of video equipment takes control of a display device, e.g. a television set, and reconstructs an incoming video signal, the necessary clock signal with a sufficiently accurate frequency can be derived or borrowed from the incoming video signal.

In the past, video equipment requiring generation of a high-accuracy clock signal for supporting video reconstruction/generation has been provided with an internal clock circuit built around a dedicated crystal oscillator. The oscillator can either be calibrated at the factory to provide a sufficiently accurate clock signal to support video reconstruction/generation or designed and built with components having extremely tight tolerances. A voltage controlled crystal oscillator VCXO is a preferred oscillator for generating the necessary high-accuracy clock signal. Because the oscillator is voltage-controlled, it requires little or no factory calibration and can be continually controlled to adjust for the effects of initial accuracy, aging or extreme temperatures.

In this arrangement, the control voltage applied to the VCXO is measured and recorded when a video signal is being received and properly displayed. This is required for proper video construction and, in the digital channel case, for preventing buffer underruns and overruns. More particularly, the terminal has a recovered clock that is frequency locked to the encoder clock in the head-end or the location where the digital video signal was originally encoded. In the analog case, the terminal has a recovered clock that is locked to the timing embedded in an analog television signal. The clock frequency in currently-used applications is typically around 27 MHz.

To reconstruct an MPEG delivered video signal or an NTSC video signal, the frequency of the VCXO must be maintained at a sufficiently accurate frequency. This is a requirement for proper video construction in both analog and digital applications. Further, in digital applications, proper timing prevents buffer underruns and overruns as well. Usually, the VCXO is common to both MPEG decoding and NTSC video reconstruction and is designed to meet the MPEG specification on its allowable offset, manufacturing, and component tolerances with an additional margin. Typically, the allowable VCXO frequency range in this type of application is +/−100 ppm from the nominal 27 MHz value. Although this VCXO range is acceptable for decoding MPEG video signals, this range far exceeds the allowable range for regenerating NTSC video signals, resulting in color deterioration, the appearance of blocks in the image, frozen image portions, or degradation of the image into a black and white image. These image problems may also occur if the VCXO characteristics allows the frequency to drift beyond the allowable frequency range for decoding MPEG signals. Timing is also a concern in generating images from analog signals, where the VCXO needs to lock to the horizontal and/or vertical timing of an analog video signal.

Consequently, there is a need for a system that prevents the VCXO frequency from exceeding an allowable range for video reconstruction and buffer management.

SUMMARY OF THE INVENTION

Accordingly, the present invention is directed to an apparatus that outputs a clock signal for video reconstruction and that includes a control logic circuit with a phase locked loop for receiving an incoming video signal and phase locking to a clock signal portion of the incoming video signal, wherein the control logic circuit outputs a control signal for controlling an output of an oscillator, which serves as the clock signal, based on the phase lock, and a frequency range bounder in the phase locked loop that receives the control signal and outputs a bounded control signal that limits the frequency of the voltage controlled oscillator to a selected range.

The invention is also directed to a frequency range bounder apparatus for limiting an oscillator frequency range. The frequency range bounder receives a control signal for controlling an output of an oscillator and outputs either the control signal itself, if the control signal is within a selected range, or a threshold value, if the control signal is outside the selected range, as a bounded control signal to the oscillator to limit the oscillator frequency.

The invention is further directed to a method for outputting a clock signal for video reconstruction in a terminal, comprising the steps of receiving an incoming video signal in a control logic circuit with a phase locked loop, phase locking to a clock signal portion of the incoming video signal, outputting a control signal for controlling an output of an oscillator based on the phase lock, and limiting the frequency of the oscillator to a selected range using a frequency range bounder in the phase locked loop that receives the control signal.

As a result, the invention prevents the frequency of a voltage controlled oscillator from surpassing an allowable frequency range for proper video reconstruction as the oscillator locks to a head-end encoder's clock frequency or an analog video channel's embedded timing.

BRIEF DESCRIPTION OF THE DRAWINGS

FIG. 1 is a block diagram illustrating a frequency bounded clock according to the present invention;

DESCRIPTION OF THE PREFERRED EMBODIMENT

Using the drawings, the preferred embodiments of the present invention will now be explained. Stated in broad principle, the present invention is directed to an apparatus and method for limiting the frequency of an oscillator, such as a voltage controlled oscillator (VCXO), which locked to the timing of an incoming video signal, within a selected acceptable range. The invention prevents the VCXO frequency from drifting, including or especially during channel acquisition, outside the acceptable range and causing video image deterioration.

FIG. 1 illustrates an embodiment of the present invention as a device for generating a clock signal in a piece of video equipment, such as a set-top terminal, when the incoming video signal 101 is a digital signal, such as an MPEG data stream. As shown in FIG. 1, the incoming digital video signal 101, i.e. the video data stream, is provided to a control logic circuit 102. The digital video signal 101 includes data fields in which program clock reference (PCR) data is provided. The PCR is a part of the MPEG (Motion Picture Experts Group) digital signal format and functions as a digital clock signal that is used to reconstruct the images carried in the digital data stream 101 for display on a television set or monitor (not shown). As is known in the art, the PCR is a time stamp of the encoder's clock frequency and is sent in the data stream at regular intervals.

Note that for an analog application, the general circuit 102 configuration shown in FIG. 1 will be the same except that an analog video signal will be sent to the circuit 102 instead of a digital data stream 101 and a sync separator will be used instead of the PCR data extractor 104.

Figure 3:
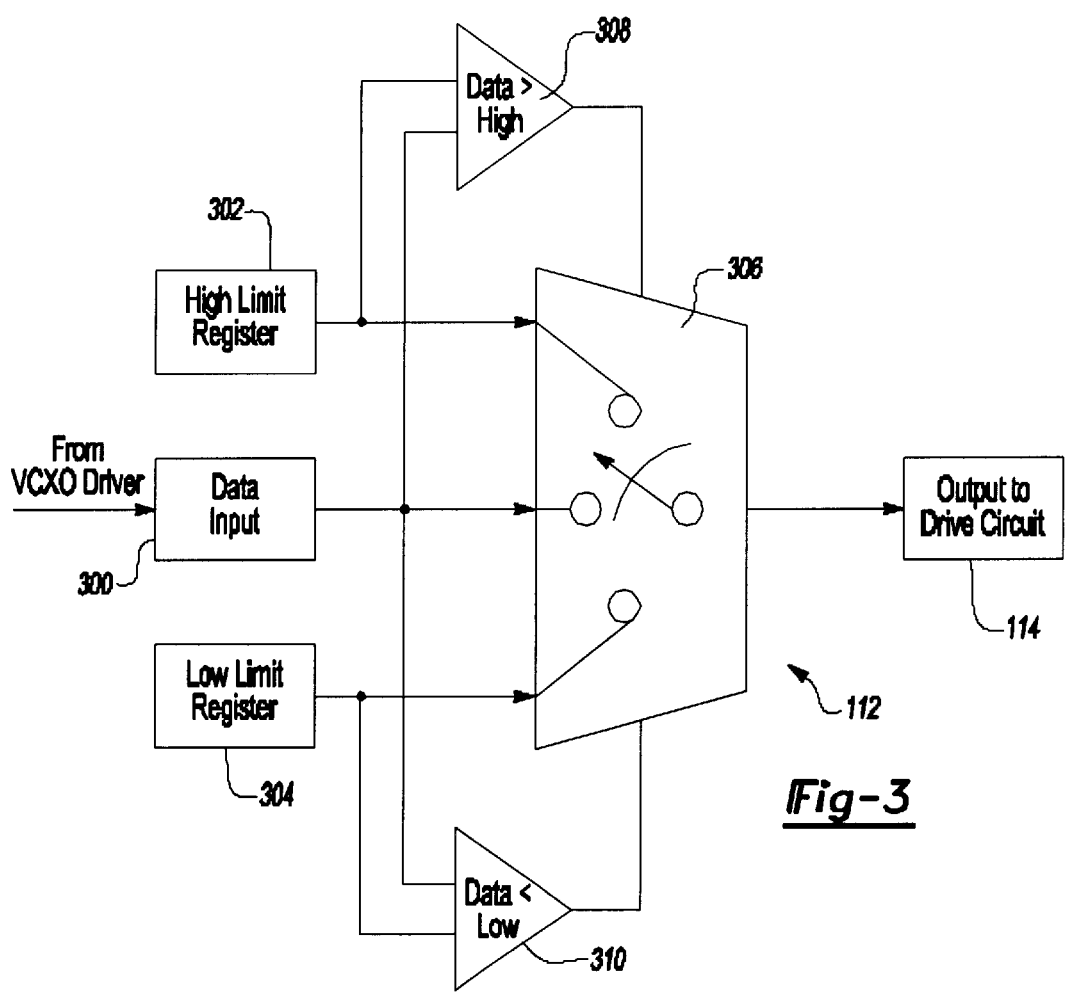
FIG. 3 is a representative diagram of a frequency range bounder of the present invention according to one embodiment.

The control logic circuit 102 is an internal phase locked loop circuit and locks to the PCR data by first receiving the digital data stream 101 into a PCR data extractor 104. The PCR data extractor 104 and counter and scaler 106 provide inputs to a comparator 108, which outputs a signal to a loop filter 110. The comparator 108 output corresponds to the difference between the time stamp of the encoder (not shown) and the terminal's internally generated time stamp, allowing continuous adjustment of the terminal's clock frequency to align it with the encoded signal's clock frequency. The loop filter 110 directs a control signal corresponding to the comparator 108 output through a VCXO driver 111, such as a pulse width modulation (PWM) circuit, to a VCXO frequency range bounder 112. The frequency range bounder 112 will then output a bounded control signal to a drive circuit 114 for driving the VCXO 116. The VCXO 116 outputs a clock signal based on the timing from the PCR and the bounded control signal from the frequency range bounder 112. The VCXO clock signal is also fed back to the counter and scaler 106 to complete the phase locked loop. Note that although FIGS. 1 and 3 show the frequency range bounder 112 receiving an input from the VCXO driver 111, the VCXO range bounder 112 can be placed anywhere in the signal path after the loop filter 110 and still have the same bounding effect. For example, the frequency range bounder 112 can be placed directly after the loop filter 110 so that the loop filter 110 output acts as the control signal. The inventive concept is the same regardless of the specific position of the frequency range bounder 112 in the signal path.

The VCXO 116 acts as the terminal's clock oscillator and locks to the head-end encoder's clock frequency through the PCR data fields contained in the MPEG video data stream. As a result, the circuit receives the time-stamps, compares the time stamps to its own internal counter 106 based on the VCXO clock frequency, and continuously adjusts the VCXO clock frequency to bring the encoder clock frequency and the terminal's VCXO clock frequency into alignment, forming a closed phase locked loop.

Figure 2A:
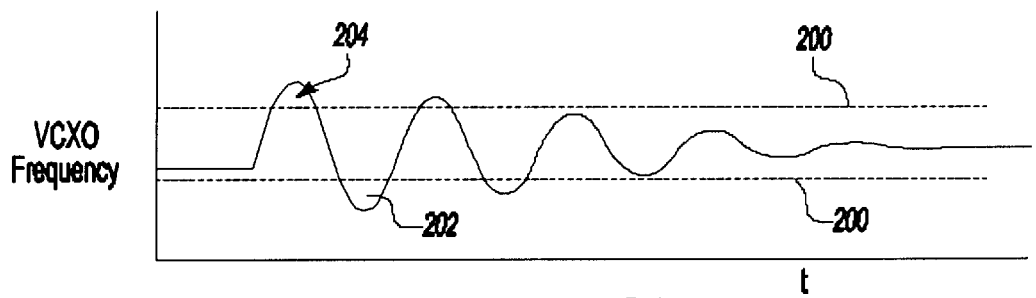
FIGS. 2a and 2b are waveforms illustrating the bounding operation according to the present invention.

Note that if the phase locked loop does not contain the frequency range bounder 112 of the invention, the loop may have frequency undershoots and overshoots as the VCXO frequency converges to the correct frequency, depending on the type of loop filter 110 implemented in the circuit, the specific loop control values, and the characteristics of the PCR data e.g., whether it is non-compliant. The frequency excursions that occur before the VCXO converges to the correct frequency may exceed the allowable frequency offset for video reconstruction and internal buffer management. An example of an unbounded VCXO frequency is shown in FIG. 2a. As can be seen in the Figure, a channel acquisition or PCR discontinuity will cause the VCXO frequency to overshoot and/or undershoot as it converges toward the correct VCXO frequency level. If the frequency excursions are large enough to go beyond the allowable tolerances 200 for proper video image reconstruction, the image itself may deteriorate e.g., lose color, shift to black and white, etc.

Figure 2B:
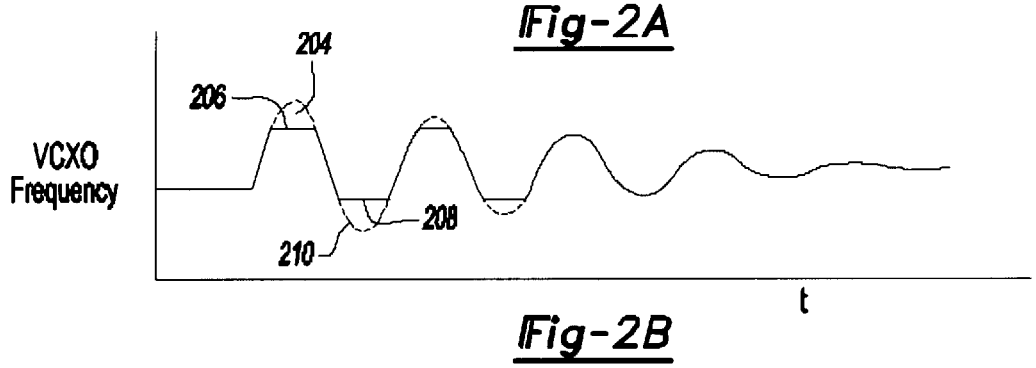

FIG. 2b illustrates a VCXO frequency that is bounded by the frequency range bounder 112 of the present invention. The undershoots 202 and overshoots 204 in the VCXO frequency that extend beyond the bounded range limits 200 are eliminated, causing the VCXO frequency to remain at an upper 206 or lower 208 frequency limit even if the incoming signal from the loop filter has a value that would ordinarily cause the VCXO frequency to be higher or lower. The specific frequency range can be based on the MPEG allowable tolerance, which is in the range of +/−30 ppm, or can be restricted further to accommodate the tight limits required in NTSC reconstruction, in the range of +/−3 ppm. Alternatively, a wider frequency range can be used based on the historical data for television receivers and monitors, in the range of +/−50 ppm. Regardless of the specific range selected, the frequency of the VCXO 116 is bounded by bounding the control voltage that controls the VCXO 116 frequency within a certain range.

FIG. 3 is a representative diagram of one possible embodiment for the frequency range bounder 112. Generally, the frequency range bounder 112 limits the control signal, such as a control voltage, to a predetermined range because the VCXO frequency varies as the control signal varies. The frequency range bounder 112 includes a data register 300 that receives the control signal from the loop filter 110 or VCXO driver 111 (depending on the specific circuit 102 configuration), a programmable high limit register 302 and a programmable low limit register 304. The high limit register 302 stores an upper value corresponding to an upper frequency level of the desired bounded range, and the low limit register 304 stores a lower value corresponding to the lower frequency level of the desired bounded range. The registers 302, 304 and values can be generally referred to as threshold registers and threshold values, respectively.

A multiplexer 306 is coupled to the data register 300 and the high and low limit registers 302, 304 so that it can direct the upper value, the lower value, or the control signal itself to the drive circuit 114 as the bounded control signal for controlling the VCXO 116 frequency. The multiplexer 306 bounds the control signal within a selected range by comparing the control signal with a value based on outputs from a high comparator 308 and low comparator 310, which compare the control signal with a high limit and a low limit, respectively. If the control signal is between the high and low limits, the multiplexer 306 will allow the control signal to pass directly through to the drive circuit 114. If the high comparator 308 indicates that the control signal is above the high limit, the multiplexer 306 will select the high limit register 304 for outputting the upper value stored in the register 304 to the drive circuit 114. Similarly, if the low comparator 310 indicates that the control signal is below the low limit, the multiplexer 306 will select the low limit register 304 for outputting the lower value stored in the register 304 to the drive circuit 114. By limiting the value of the signal sent to the drive circuit 114 to a selected range, the frequency of the VCXO 116 is also bounded within a predetermined range, as shown in FIG. 2b, thereby preventing the VCXO 116 frequency from reaching a level beyond an acceptable tolerance range and minimizing the chance of image deterioration due to excessive frequency excursions as the VCXO settles to the correct frequency.

Figure 4:
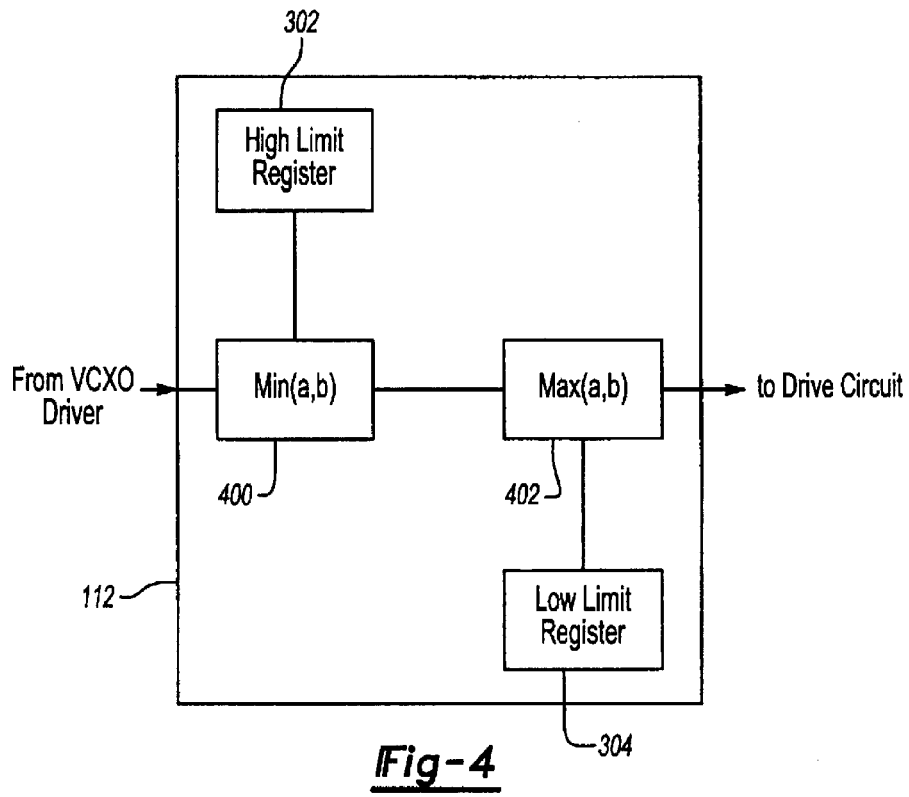
FIG. 4 is representative diagram of another embodiment of the inventive frequency range bounder.
Figure 5:
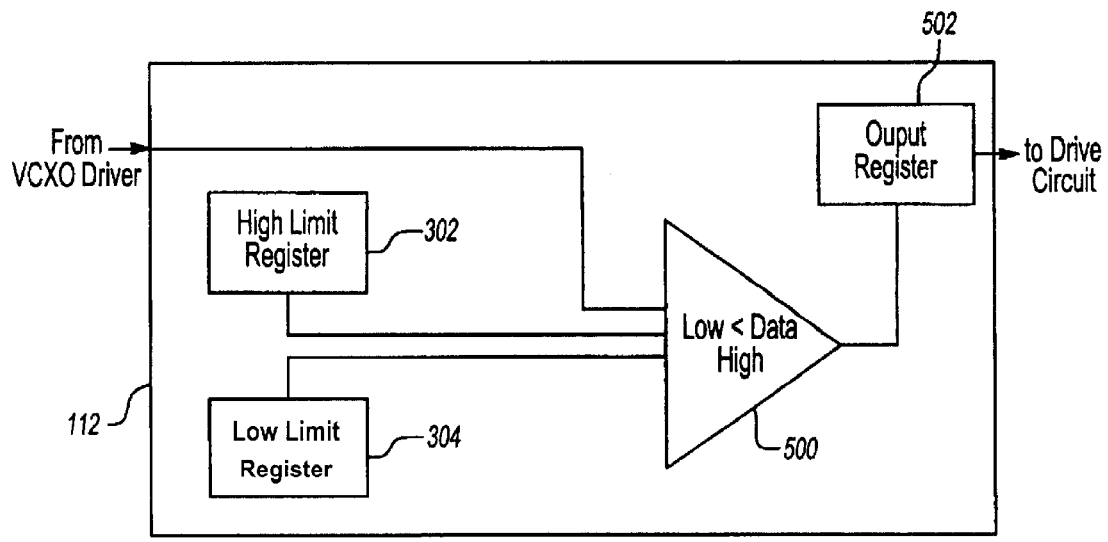
FIG. 5 is a representative diagram of a further embodiment of the inventive frequency range bounder.

FIGS. 4 and 5 illustrate alternative embodiments for the frequency range bounder 112. In the embodiment shown in FIG. 4, the high limit register 302 is coupled to a minimum function block 400 and the low limit register 304 is coupled to a maximum function block 402. The minimum function block 400 receives as inputs the control signal output by the VCXO driver 111 and the upper value stored in the high limit register 302 and outputs the smaller of the two inputs. The maximum function block 402 will then receive as inputs the minimum function block 402 output and the lower value in the low limit register 304 and outputs the larger of the two inputs. As a result, if the control signal is higher than the upper value in the high limit register 302 or lower than the lower value in the low limit register 304, the corresponding values in the registers 302, 304 are output by the frequency range bounder 112 as bounded control signal instead of the control signal itself, thereby bounding the VCXO 116 frequency within the selected range.

FIG. 5 illustrates a way in which the frequency range bounder 112 can be implemented. In this embodiment, the high limit register 302 and the low limit register 304 containing the upper and lower values, respectively, are coupled to a three-input comparator 500. The comparator 500 receives the control signal from the VCXO driver 111, the upper value from the high limit register 302 and the lower value from the low limit register 304 as inputs. The comparator 500 than compares each data value in the control signal to see whether it falls within the with the upper and lower values. Control signal data values that are outside of the window defined by the upper and lower values are discarded by the comparator 500 while data values within the window are latched into an output register 502. As a result, the values from the output register 502 are bounded by the upper and lower values, thereby bounding the VCXO 116 frequency within the selected range.

The upper and lower limits for the bounded range can be obtained in various ways. One way is to analyze the VCXO 116 and its associated tolerances to obtain the control voltage values that will allow the VCXO 116 to remain within its tolerance range during frequency centering. Another method is to statistically quantify the control voltage versus the frequency range and frequency center of a sample group of VCXOs 116 to determine the bounded range. These methods will yield a range that accounts for the VCXO's own tolerances; however, this range may still be larger than the desired for image reconstruction, particularly in view of the relatively tight tolerance ranges required by, for example, MPEG and NTSC reconstruction.

Thus, a preferred method for obtaining the upper and lower range limits will take into account the desired tolerance ranges for image reconstruction as well as the operational tolerances of the VCXO 116. This can be conducted via calibration of the VCXO 116 by first checking the control voltage to the VCXO 116 when the VCXO 116 is stable and locked to a PCR stream. This control voltage will yield the center point of the desired bounded range because most PCR streams are accurate within a few ppm. The slope of the control voltage versus frequency curve can be obtained as well because the results tend to be more consistent than the center point. Obtaining the slope can be derived by analyzing the VCXO's 116 tolerances or by calibration. Calibration may involve forcing the VCXO 116 toward its extreme limits within its acceptable tolerance range and then back-calculating the VCXO's associated frequency from data obtained by comparing the PCR data stream with the internal counter 106 at selected points in time.

In practice, the phase locked loop (not including the VCXO 116) can be implemented as hardware, firmware, or a combination of both. Note that the bounding apparatus and method described above can also be used in analog applications, where the phase locked loop is locked to the horizontal and/or vertical timing of an analog video signal.

While the invention has been specifically described in connection with certain specific embodiments thereof, it is to be understood that this is by way of illustration and not of limitation, and the scope of the appended claims should be construed as broadly as the prior art will permit.

What is claimed is:

1. An apparatus for outputting a clock signal for video reconstruction in a terminal, comprising:

an oscillator that generates the clock signal;

a control logic circuit with a phase locked loop for receiving an incoming video signal and phase locking to a clock signal portion of the incoming video signal, wherein the control logic circuit outputs a control signal for controlling an output of the oscillator based on the phase lock; and a frequency range bounder in the phase locked loop that receives the control signal and outputs a bounded control signal that bounds the frequency of the oscillator to a selected range;

wherein the frequency range bounder includes an output multiplexer and a threshold register that stores at least one threshold value and that is coupled to the output multiplexer, wherein the output multiplexer receives a control signal and outputs one of the control signal and said at least one threshold value as a bounded control signal to limit the frequency of the oscillator to the selected range;

wherein said at least one threshold register that stores at least one threshold value is a high limit register that stores an upper value and a low limit register that stores a lower value; and wherein the frequency range bounder includes at least one of a minimum function block coupled to the high limit register and a maximum function block coupled to the low limit register, wherein the minimum function block outputs the smaller of the control signal and the upper value and wherein the maximum function block outputs the larger of the control signal and the lower value as the bounded control signal.

2. An apparatus for outputting a clock signal for video reconstruction in a terminal, comprising:

an oscillator that generates the clock signal;

a control logic circuit with a phase locked loop for receiving an incoming video signal and phase locking to a clock signal portion of the incoming video signal, wherein the control logic circuit outputs a control signal for controlling an output of the oscillator based on the phase lock; and a frequency range bounder in the phase locked loop that receives the control signal and outputs a bounded control signal that bounds the frequency of the oscillator to a selected range;

wherein the frequency range bounder includes an output multiplexer and a threshold register that stores at least one threshold value and that is coupled to the output multiplexer, wherein the output multiplexer receives a control signal and outputs one of the control signal and said at least one threshold value as a bounded control signal to limit the frequency of the oscillator to the selected range;

wherein said at least one threshold register that stores at least one threshold value is a high limit register that stores an upper value and a low limit register that stores a lower value; and wherein the frequency range bounder includes a comparator coupled to the high limit register and low limit register, wherein the comparator compares the control signal with the upper and lower values and outputs the control signal to the output register if the control signal is between the upper and lower values.

3. The apparatus of claim 2, wherein the frequency range bounder includes an output register coupled to the comparator, and wherein the comparator compares the control signal by comparing data values in the control signal with the upper and lower values and latching the data values in between the upper and lower values into the output register.

4. A circuit for controlling an oscillator that outputs a clock signal for video reconstruction comprising:

a control logic circuit with a phase locked loop for receiving an incoming video signal and phase locking to a clock signal portion of the incoming video signal, wherein the control logic circuit outputs a control signal for controlling an output of the oscillator based on the phase lock;

a frequency range bounder in the phase locked loop that receives the control signal and outputs a bounded control signal that bounds the frequency of the oscillator to a selected range, wherein said frequency range bounder is configured to generate a high limit signal and a low limit signal and then select one of said control signal, said high limit signal or said low limit signal for transmission to said oscillator depending on whether said control signal remains within pre-defined high and low limits;

a minimum function block configured to receive said control signal and said high limit signal, wherein said minimum function block selectively passes whichever signal is lower, said control signal or said high limit signal; and a maximum function block configured to receive an output of said minimum function block and said low limit signal, wherein said maximum function block selectively passes whichever signal is higher, said output from said minimum function block or said low limit signal, to said oscillator.

5. A circuit for controlling an oscillator that outputs a clock signal for video reconstruction, comprising:

a control logic circuit with a phase locked loop for receiving an incoming video signal and phase locking to a clock signal portion of the incoming video signal, wherein the control logic circuit outputs a control signal for controlling an output of the oscillator based on the phase lock;

a frequency range bounder in the phase locked loop that receives the control signal and outputs a bounded control signal that bounds the frequency of the oscillator to a selected range, wherein said frequency range bounder is configured to generate a high limit signal and a low limit signal and then select one of said control signal, said high limit signal or said low limit signal for transmission to said oscillator depending on whether said control signal remains within pre-defined high and low limits;

a maximum function block configured to receive said control signal and said low limit signal, wherein said maximum function block selectively passes whichever signal is higher, said control signal or said low limit signal; and a minimum function block configured to receive an output of said maximum function block and said high limit signal, wherein said minimum function block selectively passes whichever signal is lower, said output from said maximum function block or said high limit signal, to said oscillator.

6. A method of controlling an oscillator that outputs a clock signal for video reconstruction, wherein said oscillator is controlled to remain within high and low frequency bounds, said method comprising:

receiving an incoming video signal and phase locking to a clock signal portion of the incoming video signal;

outputting a control signal for controlling an output of the oscillator based on the phase lock;

generating a high limit signal and a low limit signal;

selecting one of said control signal, said high limit signal or said low limit signal for transmission to said oscillator depending on whether said control signal remains within pre-defined defined high and low limits;

receiving said control signal and said high limit signal with a minimum function block;

with said minimum function block, selectively passing whichever signal is lower, said control signal or said high limit signal;

receiving an output of said minimum function block and said low limit signal with a maximum function block; and with said maximum function block, selectively passing whichever signal is higher, said output from said minimum function block or said low limit signal, to said oscillator.

7. A method of controlling an oscillator that outputs a clock signal for video reconstruction, wherein said oscillator is controlled to remain within high and low frequency bounds, said method comprising:

receiving an incoming video signal and phase locking to a clock signal portion of the incoming video signal;

outputting a control signal for controlling an output of the oscillator based on the phase lock;

generating a high limit signal and a low limit signal;

selecting one of said control signal, said high limit signal or said low limit signal for transmission to said oscillator depending on whether said control signal remains within pre-defined high and low limits;

receiving said control signal and said low limit signal with a maximum function block;

with said maximum function block, selectively passing whichever signal is higher, said control signal or said low limit signal;

receiving an output of said maximum fiction block and said high limit signal with a minimum function block; and with said minimum function block, selectively passing whichever signal is lower, said output from said maximum function block or said high limit signal, to said oscillator.

* * * * *